United States Patent [19]

Hagino et al.

[11] Patent Number: 5,068,219
[45] Date of Patent: Nov. 26, 1991

[54] HIGH STRENGTH SUPERCONDUCTING WIRES AND CABLES EACH HAVING HIGH CURRENT DENSITY, AND A PROCESS FOR FABRICATING THEM

[75] Inventors: Sadaaki Hagino, Urawa; Motokazu Suzuki, Omiya; Hideyuki Kondo, Omiya; Shigeru Nishikawa, Omiya; Kenichi Hayashi, Omiya, all of Japan

[73] Assignee: Mitsubishi Materials Corporation, Tokyo, Japan

[21] Appl. No.: 445,639

[22] PCT Filed: Feb. 27, 1989

[86] PCT No.: PCT/JP89/00198

§ 371 Date: Dec. 18, 1989

§ 102(e) Date: Dec. 18, 1989

[87] PCT Pub. No.: WO89/08317

PCT Pub. Date: Sep. 8, 1989

[30] Foreign Application Priority Data

Feb. 26, 1988 [JP] Japan .................................. 63-43530
Jun. 26, 1988 [JP] Japan .................................. 63-43531

[51] Int. Cl.$^5$ ...................... H01B 12/00; H01B 12/02; H01L 39/24
[52] U.S. Cl. .................................... 505/1; 174/125.1; 29/599; 505/887
[58] Field of Search .................... 505/1, 739, 740, 704, 505/813, 856, 884, 886, 887; 174/125.1, 15.4, 15.5; 29/599

[56] References Cited

FOREIGN PATENT DOCUMENTS

| 0301283 | 2/1989 | European Pat. Off. |
|---|---|---|
| 63-279512 | 11/1988 | Japan . |
| 63-292527 | 11/1988 | Japan . |
| 0065722 | 3/1989 | Japan .................................. 505/740 |
| 0161623 | 6/1989 | Japan .................................. 505/740 |

OTHER PUBLICATIONS

Wu, et al., "Superconductivity at 93 K in a New Mixed-Phase Y-Ba-Cu-O Compound System at Ambient Pressure", Physical Review Letters, The American Physical Society, vol. 58, No. 9, Mar. 2, 1987, pp. 908-910.

S. Jin, et al., "High Tc Superconductors-Composite Wire Fabrication", Applied Physics Letters, vol. 51, No. 3, Jul. 1987, pp. 203-204.

O. Kohno, et al., "Critical Current Density of Y-Ba-Cu Oxide Wires", Japanese Journal of Applied Physics, vol. 26, No. 10, Oct. 1987, pp. 1653-1654.

Primary Examiner—Leo P. Picard
Assistant Examiner—Bot Lee Ledynh
Attorney, Agent, or Firm—Cushman, Darby & Cushman

[57] ABSTRACT

A superconducting structural body comprising an oxide based superconducting ceramics powder having a perovskite structure and a metal sheath surrounding the oxide based superconducting ceramics powder, the metal sheath including an Ag portion and a non-Ag metal portion, the Ag portion existing from the inner to outer surfaces of the metal sheath, a superconducting ceramics powder portion existing in the structural body, the non-Ag metal protion used as a structural material of the metal sheath of an outermost layer of the structural body, the superconducting ceramics powder portion and the non-Ag metal portion being disposed so as to be indirectly contact each other through the Ag material, and the superconducting structural body having a compressed oriented layer in which the C-axis of the crystal in the superconducting ceramics powder is oriented in the direction perpendicular to the longitudinal direction of the superconducting structural body, and in which a thickness thereof is not smaller than 5 $\mu$m, and a process for fabricating the superconducting structural body. The superconducting composite wire and cable according to this invention each have effects that the content of Ag, which is very expensive, can be reduced compared to that needed in the conventional wire and cable, that they have excellent strength at a high or room temperature, that they have high critical current density, and they can be produced at ease.

6 Claims, 4 Drawing Sheets

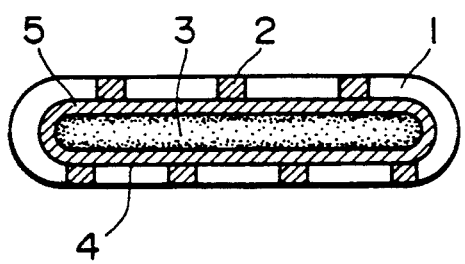
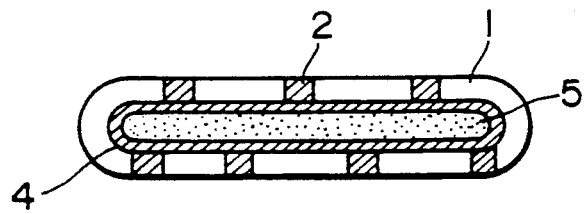
FIG.5(A)  FIG.5(B)
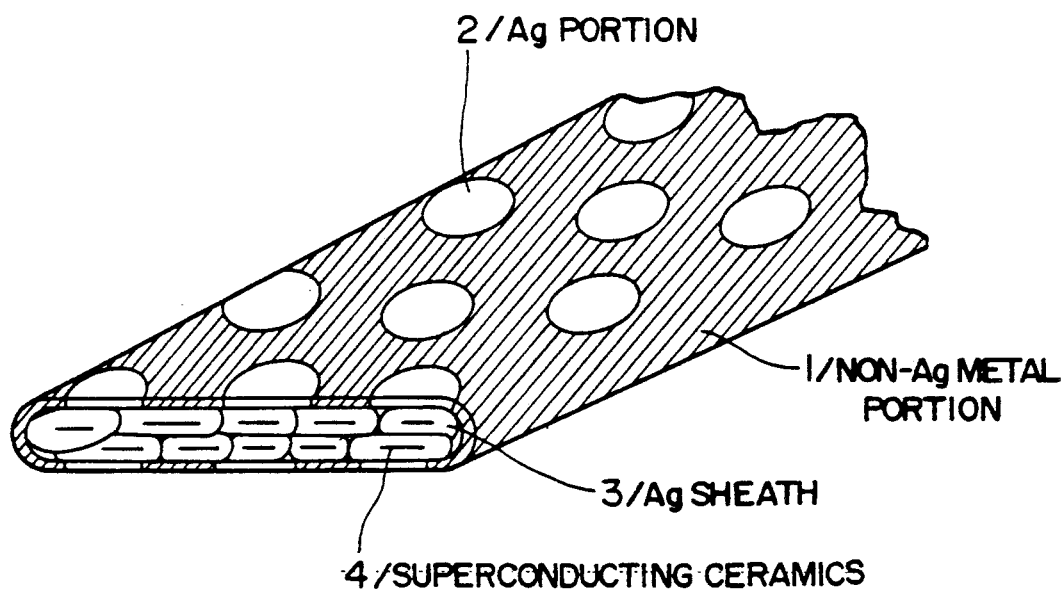
FIG.6

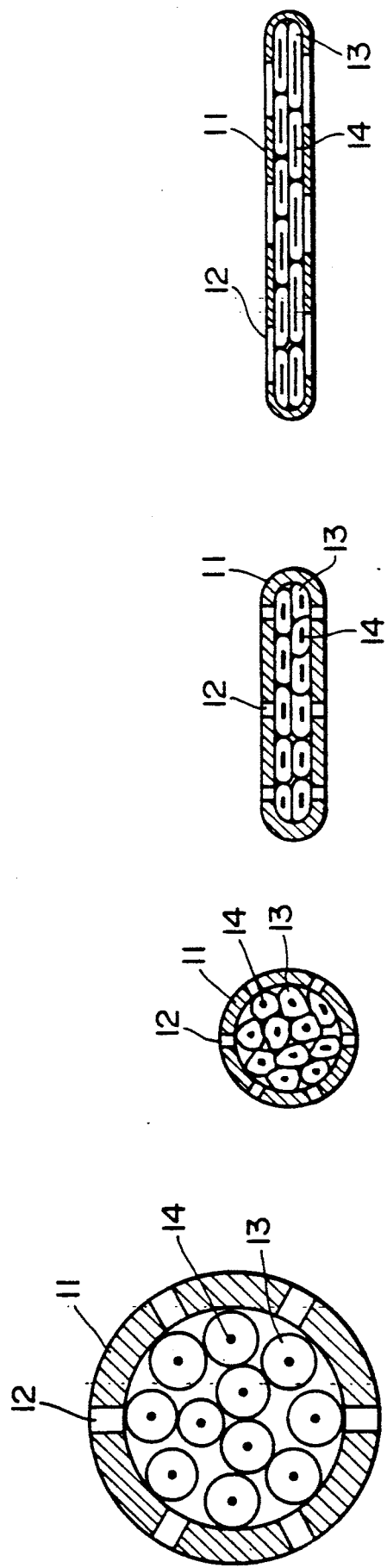

HIGH STRENGTH SUPERCONDUCTING WIRES AND CABLES EACH HAVING HIGH CURRENT DENSITY, AND A PROCESS FOR FABRICATING THEM

TECHNICAL FIELD

This invention relates to high strength superconducting wires and cables each having high critical current density, and a process for fabricating them.

BACKGROUND ART

Generally, it is known that a compound having a perovskite structure and comprising Y-including rare earth element (hereinafter, indicated by a symbol R), an alkaline earth metal (hereinafter, indicated by a symbol A), copper (Cu) and oxygen (O) (hereinafter, the compound being referred to as a superconducting ceramic) exhibits superconductive phenomena at a temperature of 77° K., which is a temperature that can be achieved by liquid nitrogen.

For fabricating a superconducting ceramics wire using the above-described superconducting ceramics powder, there is known a process which includes the following steps:

providing starting powders, i.e., an $R_2O_3$ powder, an alkaline earth metal carbonate powder as the component A, and CuO powder, each having an average grain size of not greater than 10 μm, compounding and mixing them in a predetermined compounding ratio, to obtain a mixed powder, calcining the mixed powder in the air or in an oxygenic atmosphere, at a temperature of from 850° to 950° C. to form a superconducting ceramics material having a perovskite structure, and grinding the ceramics to obtain powder of an average grain size of not greater than 10 μm, filling a pipe of silver (Ag) with the superconducting powder obtained in the previous step, sealing the both ends of the pipe under vacuum, and subjecting the silver pipe filled with the ground powder to cold-drawing, e.g., swaging, rolling with grooved rolls, processing with a die, or the like, to produce a wire having a diameter of not greater than 5 mm, heat-treating the wire in the air or an oxygenic atmosphere at sintering temperatures (for example, in the case of using Y-based superconducting ceramics oxide, the temperatures being within from 900° to 950° C.) to produce a superconducting wire.

Also, a superconducting cable has been conventionally produced by bundling a plurality of the wires produced by cold-drawing as described above, covering the bundled wires with a tube of Ag to form a cable, and then subjecting the cable to processing with a die, if required.

However, although the superconducting wires and cables produced by the above-described conventional processes each have a critical current density, Jc, of order of $10^3$ A/cm$^2$, the critical current density, Jc, of superconducting wires and cables for practical use each must be at least $10^4$ A/cm$^2$.

A process for satisfying the requirement comprises the steps of: preparing a monocrystal of a superconducting ceramics having a perovskite structure, and fabricating a superconducting wire using the monocrystal in which an electric current sends therethrough perpendicularly to the C-axial direction of the monocrystal, and a superconducting wire having a critical current density of greater than $10^4$ A/cm$^2$ can be produced (it is generally said that the above-described superconducting ceramics has high anisotropy in the crystal, and then an electric current hardly flows in the C-axial direction, but easily flows in the direction perpendicular to the C-axial direction, and the conductivity of the electric current in the C-axial direction is not greater than about 1/100 of that of one electric current in the direction perpendicular to the C-axial direction.). Even when it would be possible to produce experimentally such superconducting ceramics monocrystal in the form of a long wire, it is impossible to produce it on an industrial scale.

Also, in the case of the superconducting cable, although it would be possible to produce a cable by bundling wires, each of which is produced by filling an Ag sheath with one or more superconducting monocrystal fibers that has each a perovskite structure, and each having a C-axis of the monocrystal being oriented in the direction perpendicular to the longitudinal direction of the fiber, it is difficult to produce such monocrystal fibers at present, and therefore it is also impossible to produce a superconducting cable, comprising a bundle of the wires filled with the monocrystal fibers.

DISCLOSURE OF INVENTION

Accordingly, the present inventors have intensively investigated in order to produce superconducting wires and cables each having a critical current density on the order of $10^4$ A/cm$^2$, and have found the following facts:

(1) When the superconducting ceramics powder is subjected to molding under pressure to form a molded body, a layer in which the C-axis of crystal of the powder is oriented in the direction perpendicular to a pressed face (hereinafter, the layer being referred to as a compressed oriented layer) is formed on the surface of the molded body. The thickness of the compressed oriented layer depends upon the pressure which is exerted on the molded body by the molding operation.

(2) The orientation and thickness of the compressed oriented layer formed on the surface of the molded body are stable even after heat-treatment for sintering.

(3) Such compressed oriented layer extends to a thickness of not greater than 5 μm on the inner face of the Ag sheath of the conventional superconducting wire filled with the superconducting ceramics powder. It is considered that a superconductive electric current flows mainly through the compressed oriented layer in which the C-axis of the superconducting ceramics powder is oriented in the direction perpendicular to the longitudinal direction of the superconducting wire.

The present inventors have further investigated on the basis of such facts, and have found that the superconducting wire having a compressed oriented layer having a thickness of greater than 5 μm, in which the C-axes of all crystals are aligned in the same direction which is perpendicular to the longitudinal direction of the wire can be produced by subjecting a pipe filled with superconducting ceramics powder to swaging and then rolling with grooved rolls, and further rolling the superconducting wire obtained by such drawing at a reduction ratio of not less than about 30%. The critical current density of the wire having the compressed oriented layer of a thickness of not smaller than 5 μm can be improved so as to become a value of not lower than $10^4$ A/cm$^2$.

The present inventors have also found that a cable having the compressed oriented layer which is larger than the conventional one and having high critical current density can be produced by filling a pipe made of Ag with a plurality of superconducting wires, which is subjected to drawing without the rolling operations described above, further drawing the pipe to form a cable comprising a superconducting ceramics filled therein as dense as possible, and as a final step, rolling the cable so that its reduction ratio becomes one not less than about 30%. This invention has been made on the basis of the above-described discoveries.

It is a first object of this invention to provide a superconducting structural body, e.g., superconducting wires or cables, comprising an oxide based superconducting ceramics powder having a perovskite structure, and a covering body made of a metal, preferably Ag, filled with the oxide based superconducting ceramics powder, the superconducting structural body having a compressed oriented layer of a thickness of not smaller than 5 $\mu$m, in which the C-axis of crystal of the superconducting ceramics powder is oriented in the direction perpendicular to a longitudinal direction of the superconducting structural body.

It is a second object of this invention to provide a superconducting wire comprising an oxide based superconducting ceramics powder having a perovskite structure, and a covering body made of a metal, preferably Ag, filled with an oxide based superconducting ceramics powder, the superconducting wire having a compressed oriented layer of a thickness of not smaller than 5 $\mu$m, in which the C-axis of crystal of the superconducting ceramics powder is oriented in the direction perpendicular to the longitudinal direction of the superconducting wire.

It is a third object of this invention to provide a superconducting cable comprising a plurality of metal-covered, preferably Ag-covered, superconducting wires filled with an oxide based superconducting ceramics powder of a perovskite structure, and a pipe made of a metal, preferably Ag, the superconducting cable having a compressed oriented layer of thickness of not smaller than 5 $\mu$m, in which the C-axis of crystal of the superconducting ceramics powder is oriented in the direction perpendicular to the longitudinal direction of the superconducting cable.

It is a fourth object of this invention to provide a process for fabricating a superconducting structural body having a compressed oriented layer of a thickness of not smaller than 5 $\mu$m, in which the C-axis of crystal of the superconducting ceramics powder is oriented in the direction perpendicular to the longitudinal direction of the superconducting structural body, the process comprising rolling the superconducting structural body comprising an oxide based superconducting ceramics powder and an Ag-covering body filled with the powder so that its reduction ratio becomes one not less than about 30%.

It is a fifth object of this invention to provide a process for fabricating a superconducting wire, the process comprising the steps of: filling a sheath made of a metal, preferably Ag, with an oxide based superconducting ceramics powder of a perovskite structure, drawing the superconducting ceramics powder-filled sheath to obtain a superconducting wire, rolling the superconducting wire obtained by the drawing operation, with a flat roll so that its reduction ratio becomes one not less than about 30%, and heat-treating the wire thus rolled at a temperature high enough for sintering the superconducting ceramics.

It is a sixth object of this invention to provide a process of producing a superconducting composite cable comprising an oxide based superconducting ceramics powder having a perovskite structure and a composite tube filled with the oxide based superconducting ceramics powder, the process comprising the steps of providing a plurality of superconducting wires each formed by filling a pipe made of Ag with an oxide based superconducting ceramics powder, further providing a composite tube comprising an Ag portion and a non-Ag metal portion, the Ag portion existing from the inner surface of the composite tube to the outer surface, filling the composite tube with the superconducting wires to form a composite tube filled with superconducting ceramics powder, drawing the composite tube filled with superconducting ceramics powder to form a superconducting composite cable, rolling the thus-obtained superconducting composite cable at a reduction ratio of not less than about 30%, heat-treating the rolled superconducting composite cable at a temperature for sintering the superconducting ceramics.

According to this invention, superconducting composite wires and cables having excellent strength both at high temperatures and at room temperature and having higher critical current density can be produced with ease by using Ag in amounts less than that of conventional Ag-sheathed superconducting wires and superconducting cables.

BRIEF DESCRIPTION OF THE DRAWINGS

FIGS. 5(a) and 5(b) show enlarged views of sections of the belt-shaped wire filled with superconducting ceramics powder, respectively;

FIG. 6 shows a perspective view of a superconducting composite cable according to this invention; and FIGS. 7 through 10 show schematic sections of processes of producing a superconducting composite cable according to this invention, respectively.

BEST MODE FOR CARRYING OUT THE INVENTION

Figure 1:
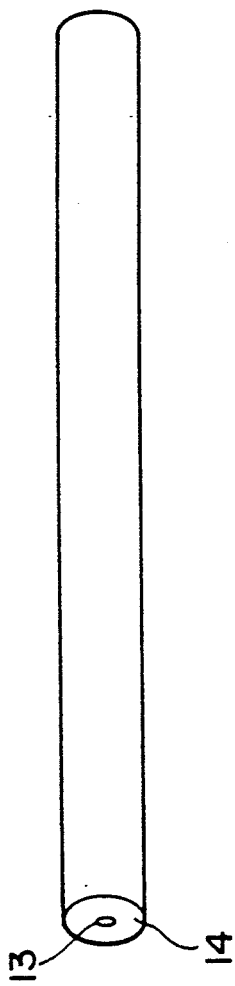
FIG. 1 shows a schematic perspective view, partially in cross section, of the conventional Ag-sheathed superconducting wire.

In this invention, there can be used as the superconducting ceramics not only Y-including rare earth elements based superconducting ceramics oxide but also Bi-based superconducting ceramics oxide such as BiSrCaCu$_2$Oy, Bi$_2$Sr$_2$Ca$_2$Cu$_3$Oy, (Bi,Pb)SrCaCuO$_{1.5\text{-}2}$ and Tl-based superconducting ceramics oxide such as Tl$_2$Ba$_2$Ca$_2$Cu$_3$Ox, Tl (Ba,Sr)$_2$CaCuO, as far as the superconducting ceramics has a perovskite structure, and releases oxygen easily.

Y-including rare earth element based superconducting ceramics powders can be prepared as described above.

Bi-based oxides are prepared by providing powders of Bi$_2$O$_3$, CaCo$_3$, SrCO$_3$, and CuO as starting powders, compounding and mixing the starting powders in a predetermined compounding ratio to obtain a mixture, and calcining the mixture in the air at the temperature of from 700° to 800° C. for a retention time of 4 to 12 hours. Also, Tl-based oxides are prepared by providing powders of $Tl_2O_3$, $CaCO_3$, $BaCO_3$, and CuO as starting powders, compounding and mixing the starting powders in a predetermined compounding ratio to obtain a mixture, and calcining the mixture in the air at a temperature of from 600° to 700° C. for a retention time of 4 to 12 hours.

In this invention, there can be used, as a material for the Ag portion, not only pure Ag but also Ag-based alloys which contain one or more metals such as platinum (Pt) that do not react with superconducting ceramics and give a good influence upon the strength of the superconducting wires in amounts not preventing oxygen permeation.

The non-Ag metal portion is preferably made of Austenitic stainless steel, Ni alloys such as Inconel and Hastelloy. The inner layer is made of Ag materials. In the superconducting composite wire according to this invention, the inner layer is made of Ag materials because when the superconducting ceramics is subjected to heat treatment while contacting the non-Ag metal materials such as Austenitic stainless steel therewith, a chemical reaction proceeds to generate oxides such as NiO, FeO, $Fe_2O_3$, or $Cr_2O_3$, resulting in considerable deterioration of the superconductive characteristics.

The sintering temperature of Y-including rare earth element-based superconducting ceramics oxides is within 900° to 950° C., for example. Also, the sintering temperature of Bi-based oxide superconducting ceramics is within 750° to 890° C., and that of Tl-based oxide superconducting ceramics is within 650° to 800° C.

The rolling with flat rolls is performed at a reduction ratio of not less than about 30%, preferably not less than 50%.

Meanwhile, the reduction ratio is represented by the following equation:

Reduction Ratio = $\{(h_0-h)/h_0\} \times 100(\%)$ wherein $h_0$ denotes the diameter or thickness of the superconducting ceramics-filled structure e.g., wire or flat-shaped wire, or the like, prior to rolling, and h denotes the thickness of the structure after rolling with flat rolls.

In the superconducting wire obtained by filling conventional superconducting ceramics powders in an Ag pipe and drawing the Ag pipe, the superconducting ceramics powder is only filled therein as dense as possible, and in this case, the thickness of the compressed oriented layer of the wire is at most 5 μm. In order to increase the thickness of the compressed oriented layer so as to be greater than 5 μm, it is necessary that the superconducting wire drawn is further rolled at a reduction ratio of not less than about 30%, preferably not less than 50%. In this case, it is achieved to form a compressed oriented layer having a thickness of not smaller than 5 μm on the inner face of the Ag sheath. In the use of Y-based superconducting ceramics powder, it is achieved to form a compressed oriented layer having a thickness on the order of 5 to 150 μm. Also, in the use of Bi-based and Tl-based superconducting ceramics powders, it is achieved to form a compressed oriented layer having a thickness of not smaller than 150 μm.

The rolling with flat rolls at a reduction ratio of not less than about 30%, preferably not less than 50% may be achieved by one or more passes. Usually it is desirable to perform the rolling as quickly as possible.

Even when the superconducting ceramics-filled wire having the compressed oriented layer formed by the above-described process is finally subjected to heat-treatment in the air or in an oxygen-containing atmosphere at a temperature high enough to sinter the superconducting ceramics, the C-axial direction and thickness of the compressed oriented layer are stable.

In the process for fabricating the superconducting cable of this invention, the same rolling as one used in the process for fabricating the superconducting wire is repeated.

The characteristics and advantages of this invention will now be explained in greater detail, with reference to the best modes of this invention as illustrated in the attached drawings.

Figure 2:
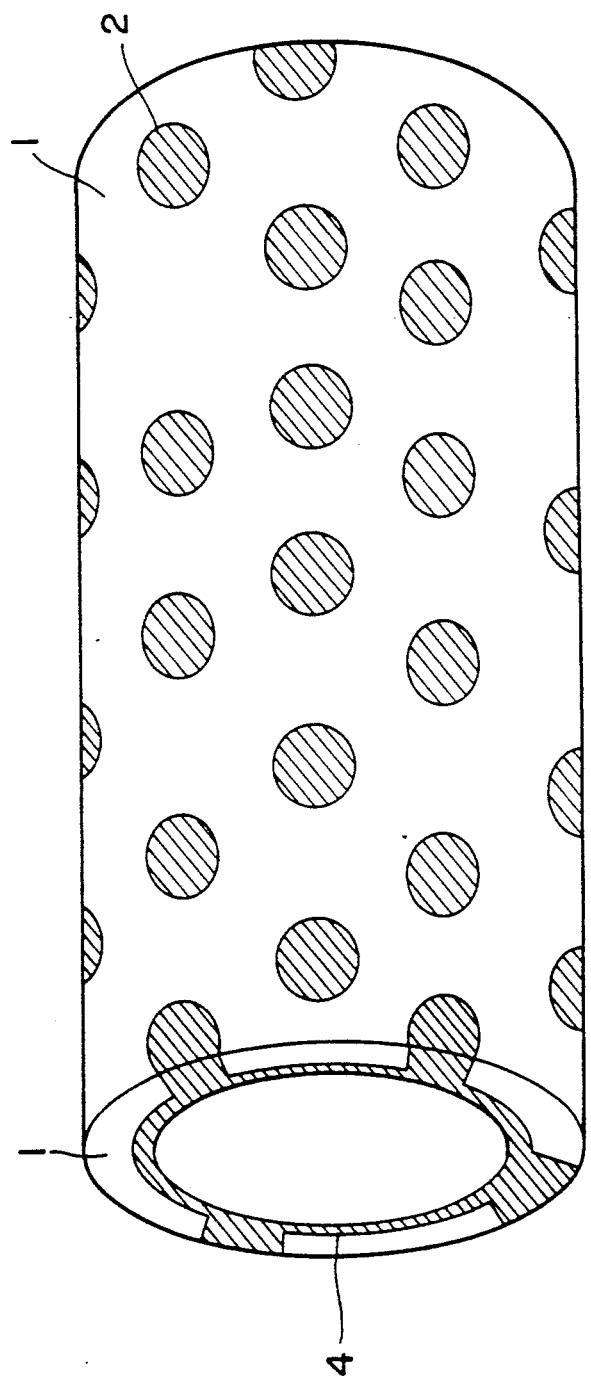
FIG. 2 shows a schematic view of a composite pipe for filling the superconducting ceramics powders.

FIG. 2 shows a schematic view of a composite pipe for use in producing the superconducting composite wire according to this invention. An outer layer of the composite pipe comprises a non-Ag metal portion 1 and an Ag portion 2, and an inner layer 4 thereof is made of an Ag material. Although the composite pipe has a circular cross section in this example, the shape of the cross section is not restricted to a circular shape. The shape may be square, rectangular, hexagonal, oval, or polygonal. In FIG. 2, although the Ag portion is circular, it is not restricted to be of circular shape. For example, the shape may also be oval, rectangular, spiral, or in the form of parallel belts.

Figure 3:
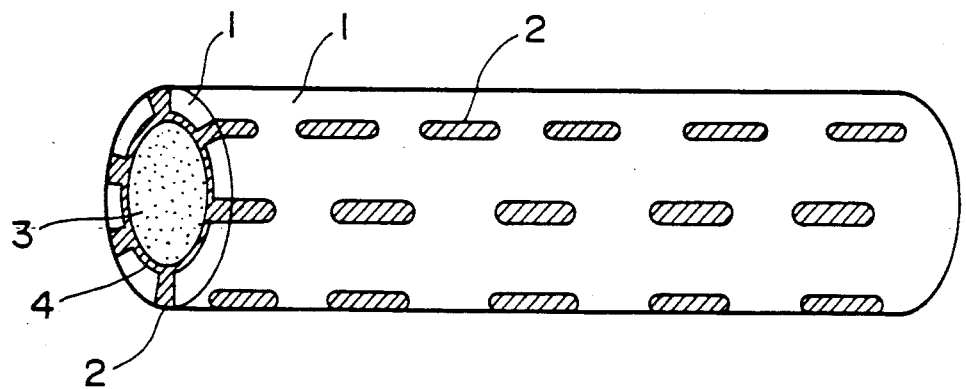
FIG. 3 shows a schematic view of a composite wire filled with superconducting ceramics powder obtained by drawing the composite pipe filled with superconducting ceramics powder.

The composite pipe is filled with superconducting ceramics powder to obtain a wire filled with the superconducting ceramics powder shown in FIG. 3. In FIG. 3, the Ag portion is oval.

Figure 4:
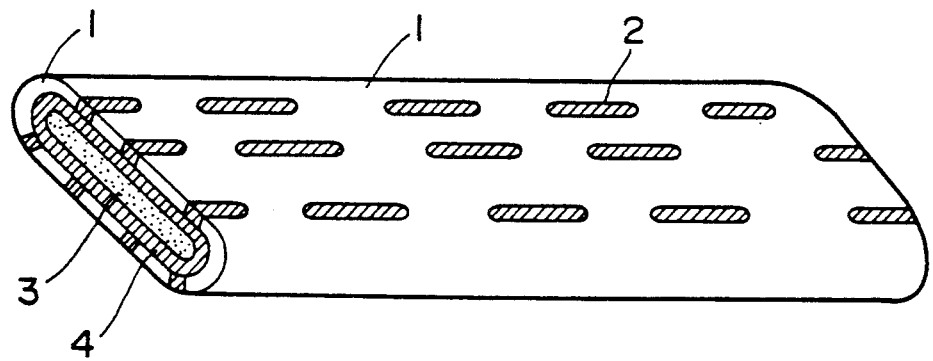
FIG. 4 shows a schematic view of a belt-shaped wire filled with superconducting ceramics powder after drawing with flat rolls, the wire having flat cross section.

The wire filled with the superconducting ceramics powder shown in FIG. 3 is subjected to rolling at a reduction ratio of not less than about 30%, preferably not less than 50% with flat rolls. As shown in FIG. 4, a belt-shaped wire filled with the superconducting ceramics powder of a flat cross-section is fabricated by rolling at one pass. An enlarged section view of the wire is illustrated in FIGS. 5(a) and 5(b).

A belt-shaped wire filled the superconducting ceramics powder is subjected to rolling with flat rolls to achieve a compressed oriented layer 5 in a portion of superconducting ceramics powder 3 thereof, as shown in FIGS. 5(a) and 5(b). The compressed oriented layer 5 is formed either along the Ag inner layer (4) as shown in FIG. 5(a), or through the overall core as shown in FIG. 5(b) so that the thickness thereof is not smaller than 5 μm.

The above-described belt-shaped wire filled with the superconducting ceramics powder is subjected to heat-treating in the air or an oxygenic atmosphere at the sintering temperature (the range of 900° to 950° C. in use of a Y-based superconducting ceramics powder) for a suitable retention time, e.g., 3 to 20 hours, to fabricate a belt-shaped superconducting wire.

FIG. 6 shows a perspective view of a superconducting cable having high critical current density and high strength.

FIGS. 7 through 10 show varied sections of the above-described superconducting composite cable in different processing steps. In FIGS. 6 through 10, reference numeral 11 denotes a non-Ag metal portion, the portion being made of excellent materials with high temperature resistance, e.g., a Ni alloy such as Inconel or Hastelloy, and an Austenitic stainless steel such as SUS304. Reference numeral 12 denotes an Ag portion, the portion being made of Ag. A composite pipe is composed of the above-described non-Ag metal portions 11 and Ag portions 12, where each of the non-Ag portions 11 retains the strength and each of the Ag portions 12 acts as a window for oxygen diffusion and transfer between the inner and outer surfaces of the composite pipe. Reference numeral 14 denotes superconducting ceramics 14, being filled in the Ag-sheath 13.

The process for fabricating the superconducting cable according to this invention is briefly explained with reference to FIGS. 7 through 10.

As shown in FIG. 7, the process for fabricating the superconducting cable comprises the steps of initially producing a composite pipe composed of Ag portions 12 and non-Ag metal portions 11, filling superconducting wires composed of an Ag-sheath 13 and a superconducting ceramics 14 in the composite pipe, drawing the composite pipe as shown in FIG. 8 to form a composite cable, subjecting the thus-drawn composite cable to slightly rolling so as to have a flat cross section as shown in FIG. 9, and then rolling with flat rolls at a reduction ratio of not less than about 30%, preferably not less than 50%, at one pass, for example, to obtain a belt-shaped composite cable, as shown in FIG. 10. The rolling operation for having a flat cross section as shown in FIG. 9 may be omitted.

The thus-obtained a belt-shaped composite cable is subjected to heat treatment in the air or in an oxygenic atmosphere at the sintering temperature of, e.g., 900° to 950° C. in the case of Y-based superconducting ceramics powder, and the resulting superconducting composite cable having high critical current density and high density can be produced.

The structure of the above-described superconducting wire is substantially shown in FIGS. 2 through 4. In FIGS. 2 through 5, reference numeral 1 denotes metal portions other than Ag (that is, non-Ag metal portions) having high temperature strength, and reference numeral 2 denotes Ag portions comprising the inner layer 4 and a part of the outer layer made of Ag. The Ag portions 2 of the outer layer are solid with the Ag portions of the inner layer 4 and exposed on the outer surface of the wire. The superconducting composite wire is formed by filling the composite pipe with a superconducting ceramics 3. As shown in FIGS. 2 through 5, when the wire is subjected to heat treatment for sintering the superconducting ceramics, Ag is exposed on a part of the outer layer of the wire, and oxygen form the ambient air can be accordingly passed and diffused inwardly through the Ag portion 2 to thereby supply oxygen to the superconducting ceramics.

The Ag portion 2 of the outer layer may have an oval shape as shown in FIG. 2, a rectangular shape as shown in FIG. 3, a parallel belt shape as shown in FIG. 4, or a crack shape as shown in FIG. 5, the shape, moreover, is not restricted to those described above, and it can take any desired shape. Furthermore, although the composite wire, as illustrated in FIGS. 2 through 5, has a circular cross section, the cross section is restricted to be circular, and may be polygonal such as square, rectangular, hexagonal and the like, oval, or any desired shape other than those described above.

FIGS. 6 through 10 show partial sectional views, with portions broken away for clarity, of the above described superconducting composite cables. In FIGS. 6 through 10, reference numeral 11 denotes the non-Ag metal portion, 12 denotes the Ag portion, 13 denotes the superconducting ceramics, and 14 denotes Ag. For comparison, FIG. 1 shows a partial sectional view, with portions broken away for clarity, of a superconducting wire including a superconducting ceramics 13 and Ag 14.

As in the superconducting composite wire, the above described materials for the non-Ag metal portions 11 are preferably Austenitic stainless steels (such as SUS304) and Ni alloys (such as Inconel or Hastelloy). The Ag portions 12 described above are present from the inner to the outer surfaces of the composite tube, and serve to diffuse oxygen released from the superconducting ceramics 13 to the ambient air or gas, and also supply oxygen to the superconducting ceramics 13 from the ambient air. Accordingly, since the composite tube is used as the Ag portion 12, it can prevent the composite tube from the formation of a bulge therein, the bulge being formed by the oxygen released from the superconducting ceramics 13. Also, by subjecting the wire to heat treatment which is performed in the air or an oxygenic atmosphere, oxygen from the ambient can pass through the Ag portion 12 in the composite tube to supply oxygen to the superconducting ceramics 13.

As described above, although the composite tube comprises the non-Ag metal portion 11 and the Ag portion 12, the Ag portion 12 may be oval as shown in FIG. 6, rectangular as shown in FIG. 7, circular as shown in FIG. 8, shaped like a parallel belt as shown in FIG. 9, or spiral as shown in FIG. 10. The shape of the Ag portion 12 is not restricted to these described above.

Furthermore, the superconducting composite cable illustrated in FIGS. 6 through 10 has a circular cross section. However, the cross section is not restricted to be circular, and may be polygonal such as square, rectangular, hexagonal, and the like, oval, or any desired shape other than those described above.

The above-described metal sheath, that is, the composite pipe in the superconducting composite wire, or the composite tube in the superconducting composite cable of this invention, can be produced by a process according to an ordinary cladding method or some method similar to the cladding method, the process comprising the steps of inserting a pipe of Ag or the like into a pipe having a window (perforations or the like) formed at a curved wall or a tube, and then drawing the resulting pipe or tube so that the Ag pipe is solid with the pipe with the window or the tube.

EXAMPLE

Next, this invention will be concretely explained with reference to the following examples.

EXAMPLE 1

As starting powders, powders of $Y_2O_3$, $BaCO_3$, and CuO, each having an average grain size of 6 $\mu$m were provided and compounded at a compounding ratio of $Y_2O_3$: 15.13%, $BaCO_3$: 52.89%, CuO: 31.98% (by weight), and the compounded powders were subjected to calcining in the air at the temperature of 910° C. for a retention time of 10 hours, and grinding, to obtain a superconducting ceramics powder having an average grain size of 2.5 $\mu$m, having a composition of $YBa_2Cu_3O_7$, and having a perovskite structure.

A composite pipe illustrated in FIG. 2 was provided, the composite pipe comprising an inner layer 4 made of Ag and an outer layer including an Ag portion 2 and a non-Ag metal portion 1 made of Austenitic stainless steel of SUS304. The inner layer 4 had dimensions of a thickness of 0.5 mm and an inner diameter of 5.0 mm, and the outer layer has dimensions of a thickness of 0.5 mm and an outer diameter of 7.0 mm. The Ag portion 2 of the outer layer comprised a composite pipe having a ring-shape cross section and having a diameter of 1.8 mm.

The composite pipe was filled with the superconducting ceramics powder 3, and then both ends of the pipe were sealed under vacuum. The sealed composite pipe was subjected to rotary swaging to obtain a wire having a diameter of 3.0 mm, and then the wire was subjected to rolling with grooved rolls to obtain a superconducting ceramics powder-filled wire having a diameter of 2.0 mm (FIG. 3).

The above-described superconducting ceramics powder-filled wire had oval-shaped Ag portions 2 at the outer layer 5.

The superconducting ceramics powder-filled wire illustrated in FIG. 3 was rolled at one pass at a reduction ratio of 80% with two flat rolls, to produce a belt-shaped superconducting ceramics powder-filled wire (FIG. 4) with a 0.4 mm-thick flat section.

A compressed orientation layer 5 was formed on the cross section of the superconducting ceramics powder-filled wire, as can be seen in the enlarged views of FIGS. 5(a) and 5(b).

The above-described belt-shaped superconducting ceramics powder-filled wire was subjected to heat treatment in the air at a temperature of 920° C. for a retention time of 15 hours to produce a belt-shaped superconducting wire. The critical current density (Jc) of the thus-obtained belt-shaped superconducting wire was measured, and the result is $1.6 \times 10^4$ A/cm$^2$.

The superconducting ceramics powder-filled layer was subjected to an orientation test which was done by cutting-off the above-described belt-shaped superconducting wire and using x-ray diffraction. There was a compressed oriented layer, in which the C-axis of the superconducting ceramics powder crystal is oriented in the direction perpendicular to the longitudinal direction of the belt-shaped superconducting wire, and in which the thickness thereof is 80 μm thick.

EXAMPLE 2

As starting materials, powders of $Y_2O_3$, $BaCO_3$, and CuO, each having an average grain size of 6 μm were provided and compounded at a compounding ratio of $Y_2O_3$: 15.13%, $BaCO_3$: 52.89%, and CuO: 31.98% (by weight). The compounded powders were subjected to calcination in the air at a temperature of 900° C. for a retention time of 10 hours and grinding, to obtain a superconducting ceramics powder having an average grain size of 2.6 μm, having a composition of $YBa_2Cu_3O_7$, and having a perovskite structure.

An Ag case having an inner diameter of 5 mm, a thickness of 1 mm, and a length of 200 mm was filled with the superconducting ceramics powder thus obtained. Both ends of the Ag case were sealed under vacuum. Subsequently, the Ag case was subjected to cold rotary-swaging, cold rolling with grooved rolls and finally rolling with grooved rolls, to obtain a superconducting wire having a diameter of 2.0 mm and a length of 1700 mm.

On the other hand, a composite pipe was provided, the pipe including the Ag portions 2 and SUS304 Austenitic stainless steel portions 1, and having dimensions of an inner diameter of 10 mm, a thickness of 1.5 mm and a length of 1000 mm. The provided composite pipe was filled with the above-described superconducting wires as shown in FIG. 7, and was then subjected to processing with die to obtain a superconducting cable of 7 mm in diameter as shown in FIG. 8. The thus-obtained superconducting cable was subjected to rolling with flat rolls at a reduction ratio of 80% at one pass to perform rolling of the composite pipe, and simultaneously the superconducting wire and superconducting ceramics of the composite pipe are rolled, so that the C-axis of the crystal in the superconducting ceramics is oriented in the direction perpendicular to the longitudinal direction of the superconducting wire. One-pass rolling operation at a reduction ratio of 80% yields a belt-shaped composite cable having a flat-cross section, as shown in FIG. 10 or FIG. 6. In this example, although the belt-shaped composite cable of FIG. 10 or 6 is produced by directly subjecting the composite cable of FIG. 8 to rolling with flat rolls, the above-described composite cable may be produced by subjecting the composite cable to a weak rolling with flat rolls and then rolling with flat rolls at a reduction ratio of not less than 50%.

The above-described belt-shaped composite cable was heat-treated in an oxygenic atmosphere at a temperature of 920° C. for a retention time of 15 hours, to produce a superconducting composite cable having high critical current density.

The critical current density (Jc) of the superconducting composite cable was measured, and the result is $2.5 \times 10^4$ A/cm$^2$. An orientation test was performed by cutting off the superconducting composite cable and then subjecting a superconducting ceramics layer thereof exposed on the cross section to x-ray diffraction. According to the orientation test, it was found that the C-axis of the crystal in the superconducting ceramics powder is oriented in the direction perpendicular to the longitudinal direction of the cable through all of the superconducting ceramics layer.

EXAMPLE 3

The same procedures as in Example 1 were repeated to produce a superconducting wire, except that Bi-based oxides or Tl-Based oxides were used instead of Y-based oxides. An orientation test of the superconducting ceramics layer was carried out by x-ray diffraction. The results are similar to those of Example 1.

INDUSTRIAL APPLICABILITY

Comparing the superconducting composite wires and cables made according to this invention and conventional superconducting wires and cables, there is almost no difference in their superconductive characteristics. However, in the superconducting composite wire and cable made according to this invention, the content of Ag, which is very expensive, can be reduced compared to that needed in the conventional wire and cable, and the superconducting composite wire and cable can be produced with high productivity without trouble such as breakage which would ordinarily occur in the final heat treatment step because the materials used have excellent strength at high temperatures, and further, because the materials used have also excellent strength at room temperature, the above-described superconducting composite wire and cable can be handled without special care, and can be serviced and examined at ease even after installation.

We claim:

1. A superconducting structural body comprising:
an oxide based superconducting ceramics powder having a perovskite structure, and
a metal sheath surrounding the oxide based superconducting ceramics powder, the metal sheath including an Ag portion and a non-Ag metal portion, the Ag portion extending from an inner to an outer surface of the metal sheath,
the non-Ag metal portion used as a structural material of an outermost layer of the metal sheath, the superconducting ceramics powder portion and the non-Ag metal portion being separated from each other with Ag material therebetween, and the superconducting ceramics powder having a compressed oriented layer in which a C-axis of the crystal in the superconducting ceramics powder is oriented in a direction of the superconducting structural body, and in which a thickness thereof is not smaller than 5 $\mu$m.

2. A process for fabricating a superconducting structural body including an oxide based superconducting ceramics powder having a perovskite structure and a metal sheath filled with the oxide based superconducting ceramics powder therein, the process comprising the steps of: providing a metal sheath including an Ag portion and a non-Ag metal portion, the Ag portion of the metal sheath extending from inner to outer surfaces of the metal sheath, and the non-Ag metal portion being used as a structural metal of the outermost layer,
filling a superconducting ceramics powder in the metal sheath so that the superconducting ceramics powder and the non-Ag metal portion of the outermost layer of the metal sheath are isolated from each other by Ag material, to form a superconducting ceramics powder-filled metal sheath,
drawing the superconducting ceramics powder-filled metal sheath to obtain a superconducting structural body,
rolling the drawn superconducting structural body at a reduction ratio of not less than substantially 30%, and
heat-treating the rolled superconducting structural body at a sintering temperature of the superconducting ceramics powder.

3. A superconducting structural body comprising:
an elongated non-Ag metal sheath,
said metal sheath including an outer metal, non-Ag portion surrounding an inner Ag portion, wherein said Ag portion extends to an exterior surface of said outer metal portion at least at one location,
a superconducting ceramic portion consisting essentially of an oxide based superconducting ceramic powder having a perovskite structure, within said metal sheath,
wherein said metal sheath further serves as a structural component and said inner Ag portion is disposed between and isolating said superconducting ceramic portion and said outer metal portion,
wherein said superconducting ceramic portion has a compressed oriented layer in which a C-axis of said perovskite structure of the superconducting ceramic portion is oriented in a direction of said superconducting structural body, and wherein said compressed oriented layer is not less than 5 $\mu$m.

4. A superconducting structural body as claimed in claim 3, wherein said structural body forms an elongated cable which includes therein:
a plurality of composite wires consisting essentially of Ag-covered superconducting ceramic material composed essentially of an oxide-based superconducting ceramic powder having a perovskite structure,
wherein said composite wires are encased in said metal sheath.

5. A process for fabricating a superconducting structural body comprising a non-Ag outer metal sheath and a superconducting ceramics portion filled with an oxide based superconducting ceramic powder having a perovskite structure, said process comprising the steps of:
(a) providing an elongated non-Ag metal sheath surrounding an inner Ag portion, wherein said Ag portion extends to an exterior surface of said outer metal portion at least at one location,
(b) filling said sheath with said superconducting ceramic powder so that said Ag portion separates said outer sheath from said superconducting ceramic powder,
(c) sealing ends of said sheath to provide a filled sheath,
(d) subjecting said filled sheath to deformation processing, including drawing operations,
(e) after said step (d), subjecting said filled sheath to further deformation processing, including rolling, so as to provide a reduction ratio of not less than substantially 30% to provide a rolled body, and
(f) heat-treating said rolled body at a sintering temperature to correspond with said oxide based superconducting ceramic powder.

6. A process for fabricating the superconducting structural body as claimed in claim 5, wherein said structural body is a superconducting cable, wherein said superconducting ceramic powder is within each of a plurality of composite wires each including Ag-covered superconducting ceramic material.

* * * * *

UNITED STATES PATENT AND TRADEMARK OFFICE
CERTIFICATE OF CORRECTION

PATENT NO. : 5,068,219

DATED : November 26, 1991

INVENTOR(S) : HAGINO, et al.

It is certified that error appears in the above-identified patent and that said Letters Patent is hereby corrected as shown below:

On the Title page, the date of the second-listed priority document should read:

[30] Foreign Application Priority Data
  Feb. 26, 1988 [JP] ............ 63-43530
  Feb. 26, 1988 [JP] ............ 63-43531

Signed and Sealed this

First Day of March, 1994

Attest:

BRUCE LEHMAN

*Attesting Officer*  *Commissioner of Patents and Trademarks*